(12) United States Patent
Lee et al.

(10) Patent No.: US 11,113,135 B2
(45) Date of Patent: Sep. 7, 2021

(54) MEMORY DEVICE AND METHOD FOR HANDLING INTERRUPTS THEREOF

(71) Applicant: Winbond Electronics Corp., Taichung (TW)

(72) Inventors: Cheng-Han Lee, Xinfeng Township, Hsinchu County (TW); Chien-Ti Hou, Chiayi (TW); Ying-Te Tu, New Taipei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/573,353

(22) Filed: Sep. 17, 2019

(65) Prior Publication Data

US 2020/0089560 A1    Mar. 19, 2020

(30) Foreign Application Priority Data

Sep. 18, 2018  (TW) .................................. 107132789

(51) Int. Cl.
*G06F 11/07* (2006.01)
*G11C 29/42* (2006.01)
(Continued)

(52) U.S. Cl.
CPC ........ *G06F 11/0772* (2013.01); *G06F 11/076* (2013.01); *G11C 11/4063* (2013.01);
(Continued)

(58) Field of Classification Search
CPC .............. G06F 11/0772; G06F 11/076; G11C 11/40615; G11C 11/40626; G11C 11/4063; G11C 29/42
See application file for complete search history.

(56) References Cited

U.S. PATENT DOCUMENTS 5,583,823 A    12/1996  Park
5,867,687 A *  2/1999  Simpson ................. G06F 13/26
                                                    710/264
(Continued)

FOREIGN PATENT DOCUMENTS

CN      1804822 A    7/2006
TW      201428763 A  7/2014

OTHER PUBLICATIONS

Office Action dated May 8, 2021 in CN Application No. 201811228310.3, 7 pages.

*Primary Examiner* — Tim T Vo
*Assistant Examiner* — Phong H Dang
(74) *Attorney, Agent, or Firm* — Muncy, Geissler, Olds and Lowe, P.C.

(57) ABSTRACT

A memory device is provided. The memory device includes: a memory cell array; a monitoring circuit, and an event-checking circuit. The monitoring circuit is configured to detect one or more event parameters of the memory cell array, wherein the one or more event parameters correspond to one or more interrupt events of the memory cell array. The event-checking circuit is configured to determine whether to assert an interrupt signal according to the one or more event parameters detected by the monitoring circuit. In response to the event-checking circuit determining to assert the interrupt signal, a processor handles the one or more interrupt events of the memory device according to the interrupt signal.

18 Claims, 8 Drawing Sheets

(51) Int. Cl.
*G11C 11/406* (2006.01)
*G11C 11/4063* (2006.01)

(52) U.S. Cl.
CPC .. *G11C 11/40615* (2013.01); *G11C 11/40626* (2013.01); *G11C 29/42* (2013.01)

(56) References Cited

U.S. PATENT DOCUMENTS

| | | |
|---|---|---|
| 8,588,017 B2 | 11/2013 | Park et al. |
| 2005/0182879 A1 | 8/2005 | Vu |
| 2007/0033492 A1* | 2/2007 | Weber ................ G06F 11/1068 714/766 |
| 2010/0299470 A1* | 11/2010 | Uno ..................... G06F 9/4812 710/260 |
| 2011/0299352 A1 | 12/2011 | Fujishiro et al. |
| 2015/0243338 A1* | 8/2015 | Sohn .................... G11C 11/406 365/189.05 |
| 2016/0091954 A1* | 3/2016 | de la Cropte de Chanterac ........ G06F 1/3206 713/322 |
| 2018/0275872 A1* | 9/2018 | Benisty ................ G06F 3/0679 |
| 2019/0130979 A1* | 5/2019 | Jean ....................... G11C 16/04 |
| 2019/0266036 A1* | 8/2019 | Franco ................ G06F 11/076 |

* cited by examiner

MEMORY DEVICE AND METHOD FOR HANDLING INTERRUPTS THEREOF

CROSS REFERENCE TO RELATED APPLICATIONS

This application also claims priority of Taiwan Patent Application No. 107132789, filed on Sep. 18, 2018, the entirety of which is incorporated by reference herein.

BACKGROUND OF THE INVENTION

Field of the Invention

The present invention relates to memory devices, and, in particular, to a memory device and a method for handling interrupts thereof.

Description of the Related Art

With regard to the dynamic random access memory (DRAM) on a computer system, the host (e.g., a central processing unit) has to periodically issue a DRAM refresh command to the DRAM. However, frequent updates may place a big burden on the DRAM controller. To maximize the DRAM bandwidth, a memory-bank interleaving scheme is generally used, so that the host may simultaneously access different memory banks in the DRAM. While the host performs the memory-bank interleaving scheme, the function of auto refresh or self refresh of the DRAM will be turned off by the host. If the host is improperly controlled, it may cause data loss in the DRAM and cause system data errors, or even cause damage to the entire system.

BRIEF SUMMARY OF THE INVENTION

A detailed description is given in the following embodiments with reference to the accompanying drawings.

In an exemplary embodiment, a memory device is provided. The memory device includes: a memory cell array; a monitoring circuit, and an event-checking circuit. The monitoring circuit is configured to detect one or more event parameters of the memory cell array, wherein the one or more event parameters correspond to one or more interrupt events of the memory cell array. The event-checking circuit is configured to determine whether to assert an interrupt signal according to the one or more event parameters detected by the monitoring circuit. In response to the event-checking circuit determining to assert the interrupt signal, a processor handles the one or more interrupt events of the memory device according to the interrupt signal.

In another exemplary embodiment, a method for handling interrupts in a memory device is provided. The memory device comprises a memory cell array and a control logic, and the control logic controls the memory cell array in response to a command from a processor. The method includes the steps of: detecting one or more event parameters of the memory cell array, wherein the one or more event parameters correspond to one or more interrupt events of the memory cell array; determining whether to assert an interrupt signal according to the detected one or more event parameters; and in response to determining to assert the interrupt signal, utilizing the processor to handle the one or more interrupt events of the memory device in response to the interrupt signal to restore the memory device to normal operation.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
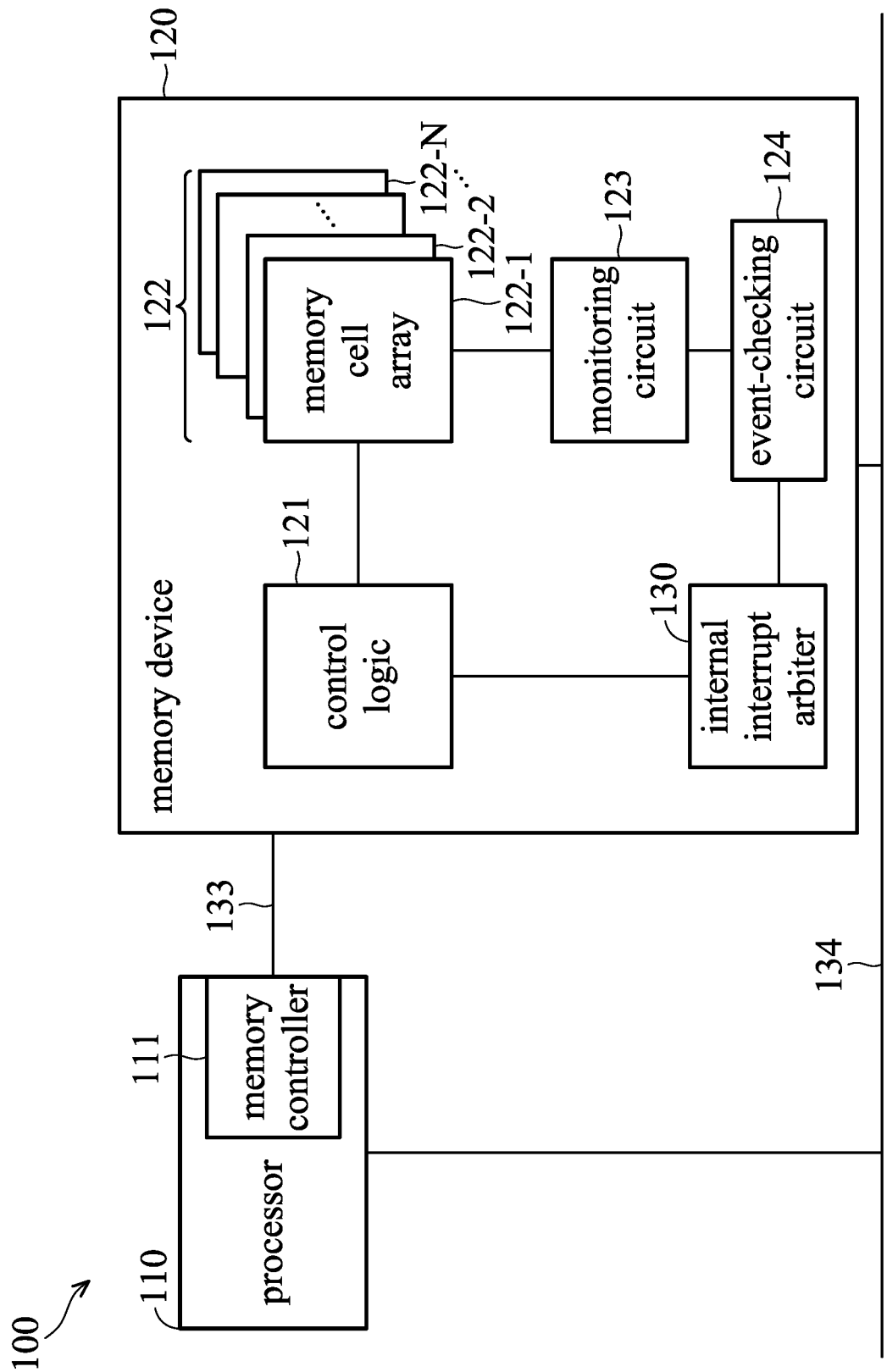
FIG. 1 is a block diagram of a computer system in accordance with an embodiment of the invention.

Referring to FIG. 1, in an embodiment, a computer system 100 includes a processor 110 and a memory device 120. The processor 110 may be a central processing unit (CPU) or a general-purpose processor, but the invention is not limited thereto. The processor 110 includes a memory controller 111 that is electrically connected to the memory device 120 via a memory bus 133, thereby controlling access to the memory device 120.

In an embodiment, the memory device 120 can be a dynamic random access memory (DRAM) chip. The memory device 120 includes a control logic 121, a plurality of memory cell arrays 122-1~122-N, a monitoring circuit 123, an event-checking circuit 124, and a internal interrupt arbiter 130.

The control logic 121 is configured to control the memory cell arrays 122-1~122-N according to a command from the processor 110. The memory cell arrays 122-1~122-N may be DRAM cell arrays that are divided into a plurality of memory banks. For purposes of description, the memory cell arrays 122-1~122-N in FIG. 1 can be collectively regarded as the memory cell array 122.

The monitoring circuit 123 is configured to detect one or more event parameters of the memory cell array 122, such as an update time count, an operation temperature, an operation voltage, a leakage current, usage of memory rows/columns, or error-correction-code (ECC) coverage, but the invention is not limited thereto. The monitoring circuit 123 may be the collective name for a plurality of monitoring sub-circuits (not shown), and each monitoring sub-circuit is configured to detect a respective event parameter. In some embodiments, a portion of the monitoring sub-circuits can be integrated into the memory cell array 122, and configured to detect information about the memory cell array 122, such as the voltage, leakage current, etc. In some embodiments, a portion of the monitoring sub-circuits can be implemented by a sensor or a timer such as a temperature sensor or a refresh timer.

The event-checking circuit 124 is configured to generate an interrupt-event signal corresponding to each of the event parameters according to the one or more event parameters detected by the monitoring circuit 123. For example, when the refresh timer value has exceeded a predetermined refresh time, the event-checking circuit 124 may generate the interrupt-event signal corresponding to the refresh timer value, thereby indicating occurrence of the interrupt event corresponding to the refresh timer value.

The event-checking circuit 124 may determine whether to assert an interrupt signal according to the generated interrupt-event signal. For example, the event-checking circuit 124 may preset a weighting parameter corresponding to each interrupt event, and calculate a sum value of the weighting parameter of each event parameter. In an embodiment, when the sum value is larger than or equal to a predetermined threshold, the event-checking circuit 124 may assert an interrupt signal, and directly transmit the asserted interrupt signal to the processor 110 through a physical interrupt pin of the memory device 120 (e.g., via the internal interrupt arbiter 130). Then, the processor 110 may take appropriate actions on the one or more interrupt events of the memory device 120 according to the received interrupt signal, and the details will be described later.

The internal interrupt arbiter 130 may transmit interrupt signals from different devices in the computer system 100 to the processor 110 according to an arbitration mechanism. For example, the internal interrupt arbiter 130 may receive the interrupt signal from the event-checking circuit 124, and transmit the interrupt signal to the processor 110 through a physical interrupt pin of the memory device 120 via the bus 134 (e.g., a system bus) according to the arbitration mechanism, so that the processor 110 may handle the one or more interrupt events of the memory device 120, where the details will be described later. In some embodiments, the internal interrupt arbiter 130 can be disposed outside the memory device 120, such as being connected to the bus 134. Specifically, a memory module can be electrically coupled to the processor 110 via the bus 134, and the memory module can be a collective name of a dual in-line memory module (DIMM) or a single in-line memory module (SIMM) which includes a plurality of memory devices 120 (e.g., DRAM chips). For example, each memory device 120 on the DIMM may have a physical interrupt pin to transmit the interrupt signal to the processor via the bus 134. If there are 8 memory devices (e.g., DRAM chips) on the DIMM module, the DIMM module will have 8 physical interrupt pins connected to the bus 134. Thus, the processor 110 can recognize which memory device 120 on the DIMM has asserted its own interrupt signal, and then the processor 110 may handle the interrupt events of the memory device 120 which has asserted the interrupt signal.

Figure 2A:
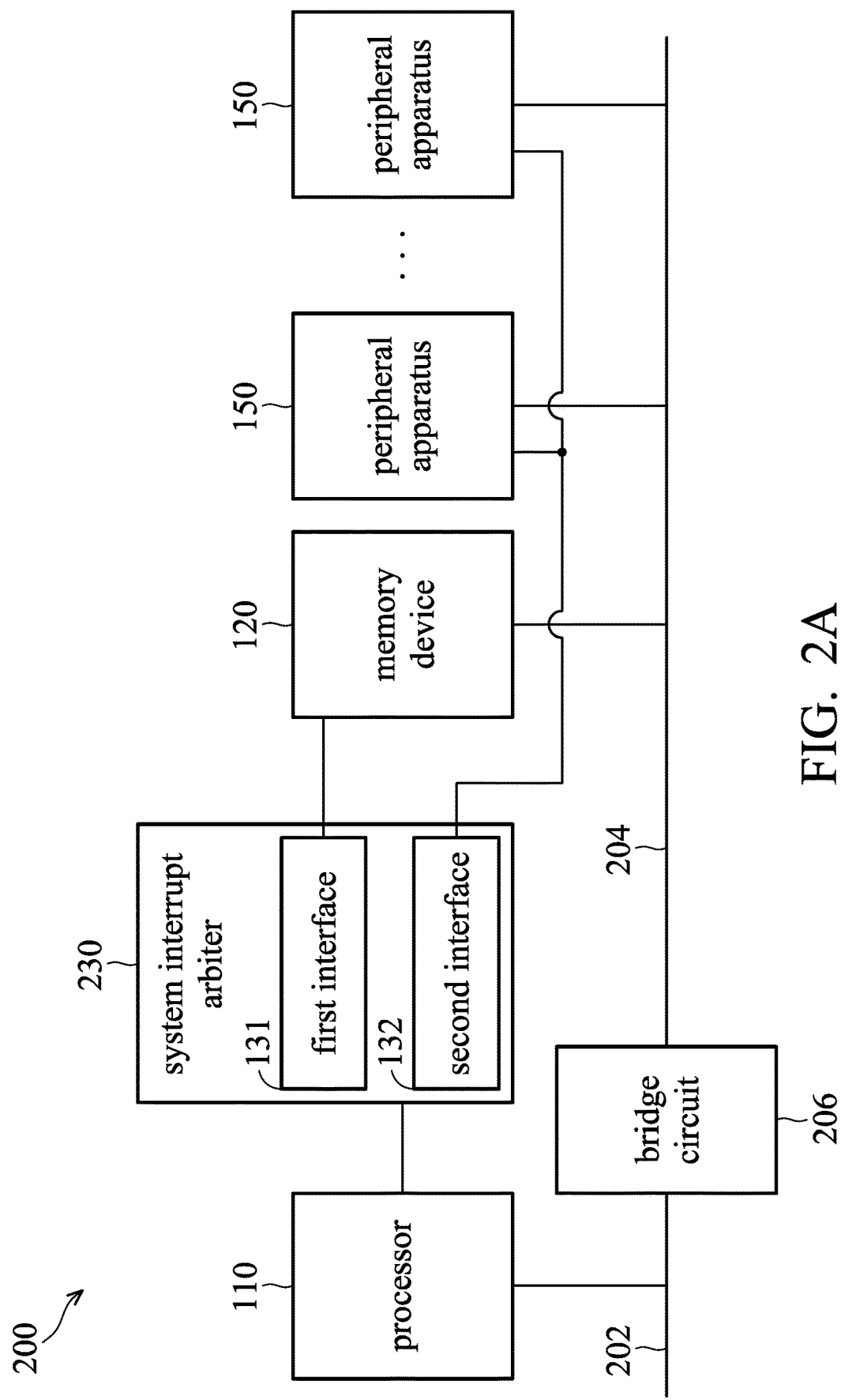
FIG. 2A is a block diagram of a computer system in accordance with another embodiment of the invention.

Referring to FIG. 2A, in some embodiments, the computer system 100 can be implemented by the computer system 200 in FIG. 2A. The difference between the computer systems 100 and 200 is that the computer system 200 may support the advance microcontroller bus architecture (AMBA) which includes a high-speed bus 202 and a low-speed bus 204. For example, the high-speed bus 202 may be an advanced high-performance bus (AHB) or an advanced system bus (ASB) that is used to connect high-speed components such as the processor 110, an on-chip memory, and a DMA controller. The low-speed bus 204 may be an advanced peripheral bus (APB). The high-speed bus 202 and the low-speed bus 204 may convert their bus signals using a bridge circuit 206.

Figure 2B:
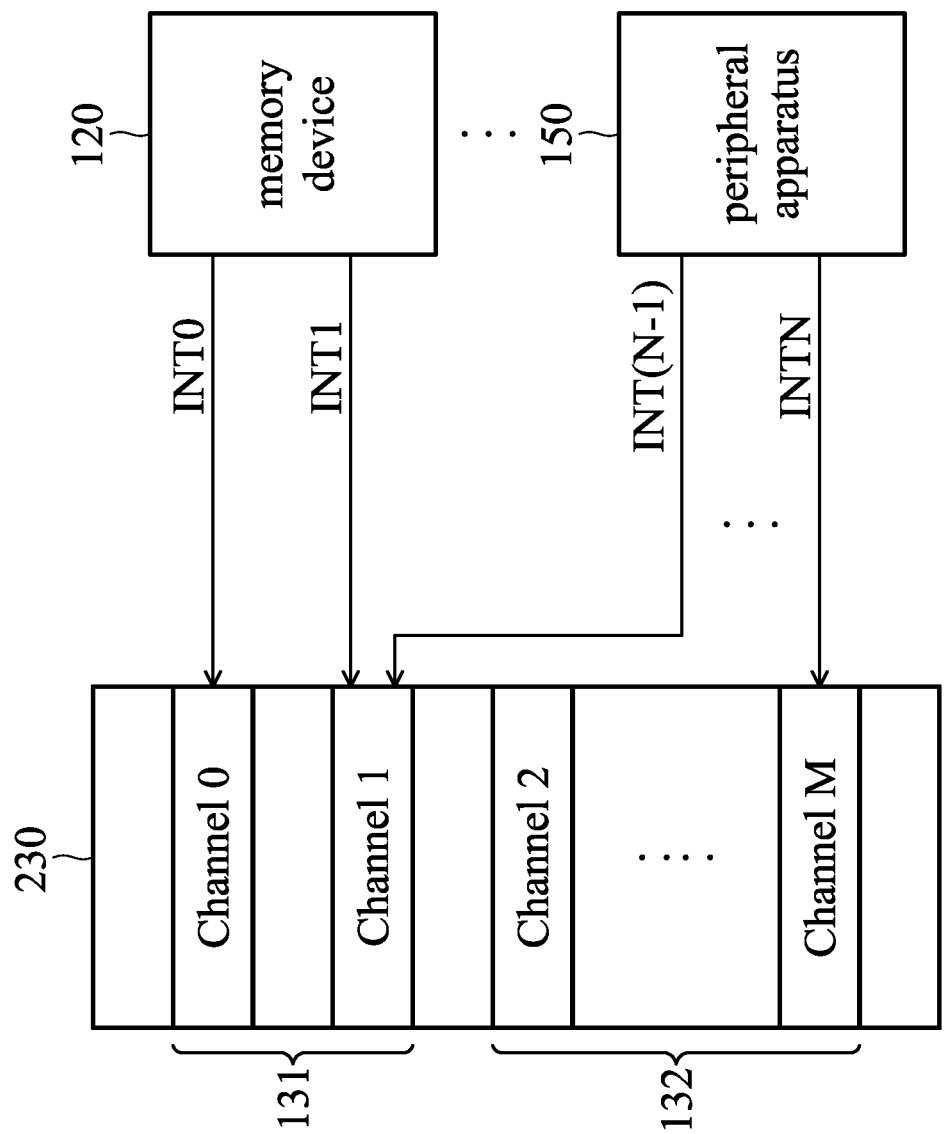
FIG. 2B is a diagram of the relationships between the interrupt channels in accordance with an embodiment of the invention.

Referring to FIG. 2A and FIG. 2B, the system interrupt arbiter 230 of the computer system 200 is disposed outside the memory device 120, and is electrically connected to the processor 110, memory device 120, and various peripheral apparatuses 150. The system interrupt arbiter 230 is configured to receive the interrupt signal from the event-checking circuit 124 of the memory device 120 and the interrupt signal from each peripheral apparatus 150, and transmit the interrupt signals to the processor 110 according to an arbitration mechanism. The system interrupt arbiter 230 includes a first interface 131 and a second interface 132. The first interface 131, for example, includes signal pins for fast interrupt requests (FIQ), and the second interface 132 includes signal pins for the interrupt request (IRQ). The priority of the first interface 131 is higher than that of the second interface 132, and the interrupt signal of the second interface 132 can be interrupted by the interrupt signal of the first interface 131.

If there are M+1 channels in the system interrupt arbiter 230, the first interface 131 includes the two channels having the highest priority, such as channel 0 and channel 1, and the memory device 120 may issue an interrupt signal INT0 or INT1 to channel 0 or channel 1.

The second interface 132 includes other channels such as from channel 2 to channel M. It is assumed that the number of memory devices and other peripheral apparatuses 150 is N, and N is larger than M. The interrupt signals, such as INT2~INTN, issued by the peripheral apparatuses 150 other than the memory device 120 are transmitted to channel 2 to channel N of the second interface 132, respectively. It should be noted that the interrupt signal issued by the memory device 120 is connected to channel 0 and/or channel 1. That is, the interrupt signal from the memory device 120 has the highest priority. Accordingly, when the processor 110 has received the interrupt signal in channel 0 or channel 1 of the first interface 131 issued by the system interrupt arbiter 230, the processor 110 will handle the one or more interrupt events of the memory device 120 with the highest priority.

Figure 3:
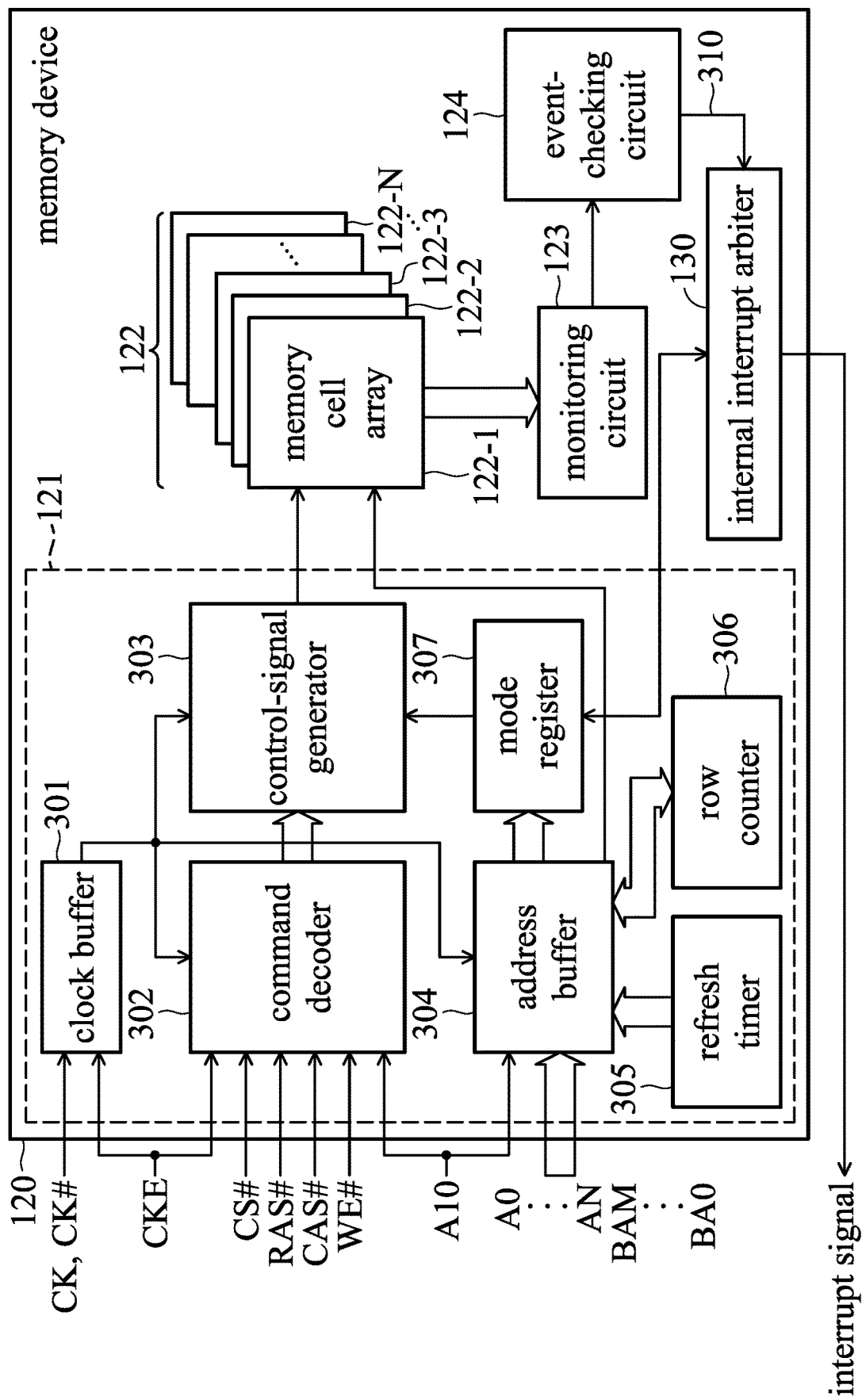
FIG. 3 is a diagram of the memory device in accordance with the embodiment of FIG. 1.

Referring to FIG. 3, the control logic 121 includes a clock buffer 301, a command decoder 302, a control-signal generator 303, an address buffer 304, a refresh timer 305, a row counter 306, and a mode register 307.

The clock buffer 301 receives a clock signal CK, an inverted clock signal CK #, and a clock enable signal CKE from the clock generator (not shown) of the computer system 100, and provide the buffered clock signal CK, inverted clock signal CK #, and clock enable signal CKE to other components in the control logic 121.

The command decoder 302 is configured to decode control signals from the processor 110, such as a chip select signal (CS #), a row address strobe signal (RAS #), a column address strobe signal (CAS #), and write enable signal (WE #), and transmit the decoded command to the control-signal generator 303.

The address buffer 304 is configured to buffer command addresses from the processor 110, such as A0~AN, and transmit the buffered command addresses to the memory cell array 122 and the mode register 307.

The mode register 307 may pre-record a plurality of operation modes and a status of the interrupt event corresponding to each event parameter. The value stored in the mode register 307 can be modified by the addresses A0~AN and BA0~BAM issued by the processor 110, or modified by the event-checking circuit 124 via the internal interrupt arbiter 130, wherein the numeric values of N and M can be adjusted according to practical conditions. Specifically, in response to interrupt events of one or more event parameters being detected by the event-checking circuit 124, the event-checking circuit 124 may modify the values corresponding to the interrupts in the mode register 307 to the interrupt-event status. When the processor 110 has handled the one or more interrupt events occurred in the memory device 120 according to the interrupt signal 310 issued by the memory device 120, the processor 110 may modify the values corresponding to the interrupt events, that have been handled by the processor 110, in the mode register 307 to a normal status. More details about the operations in the mode register 307 will be described in the embodiment of FIG. 5.

The control-signal generator 303 may generate corresponding control commands according to the operation mode recorded in the mode register 307 and the decoded commands from the command decoder 302, wherein the control commands may be an active command, a read command, a write command, a pre-charge command, an auto-refresh command, a self-refresh command, etc. A person of ordinary skill in the art will appreciate the details for generating various control commands by the control-signal generator 303, and thus the details will be omitted here.

Figure 4A:
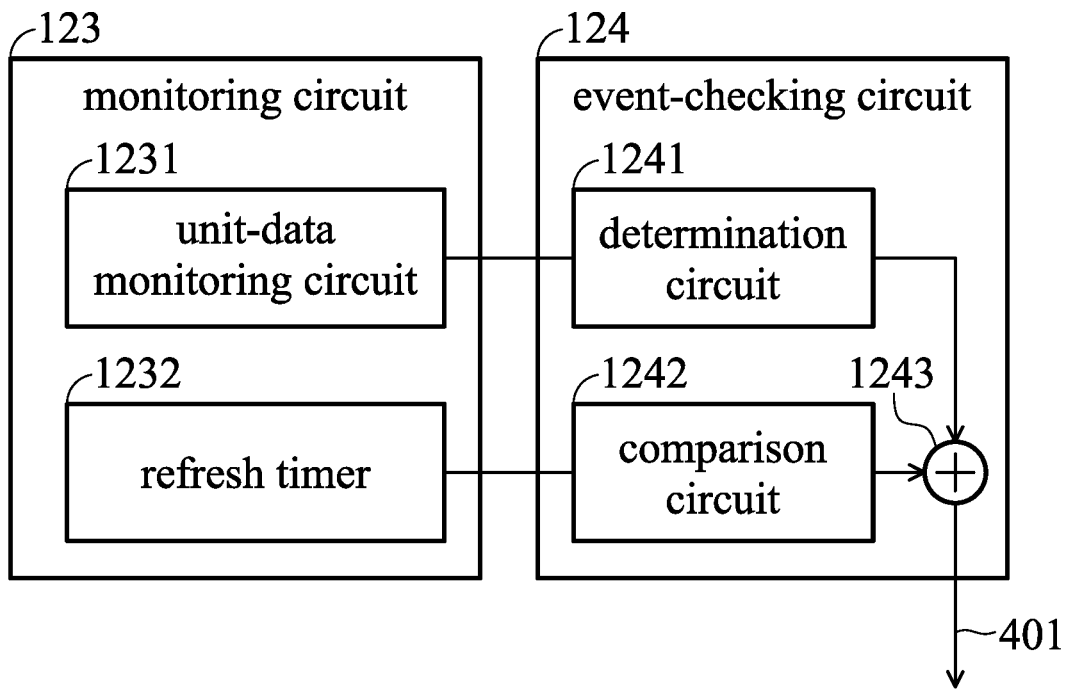
FIGS. 4A~4C are diagrams of the event-checking circuit in accordance with an embodiment of the invention.
Figure 4B:
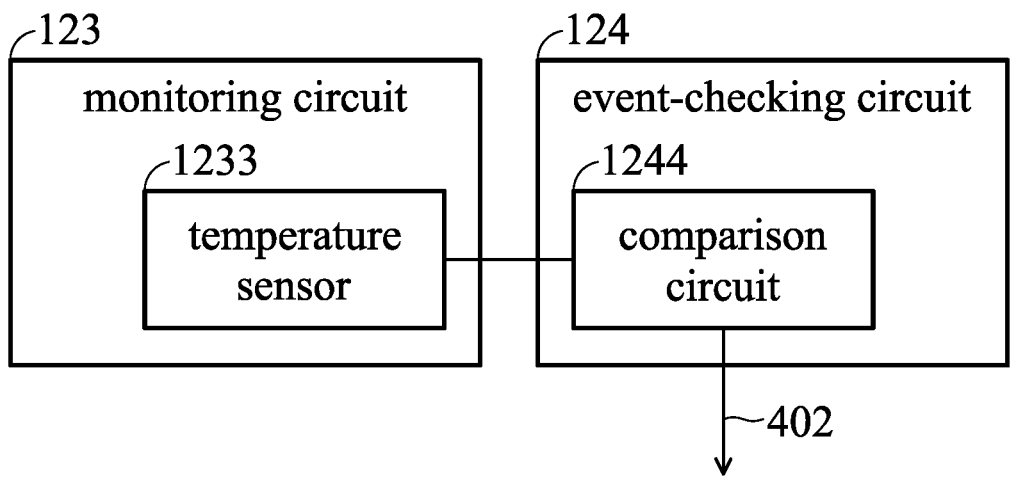
Figure 4C:
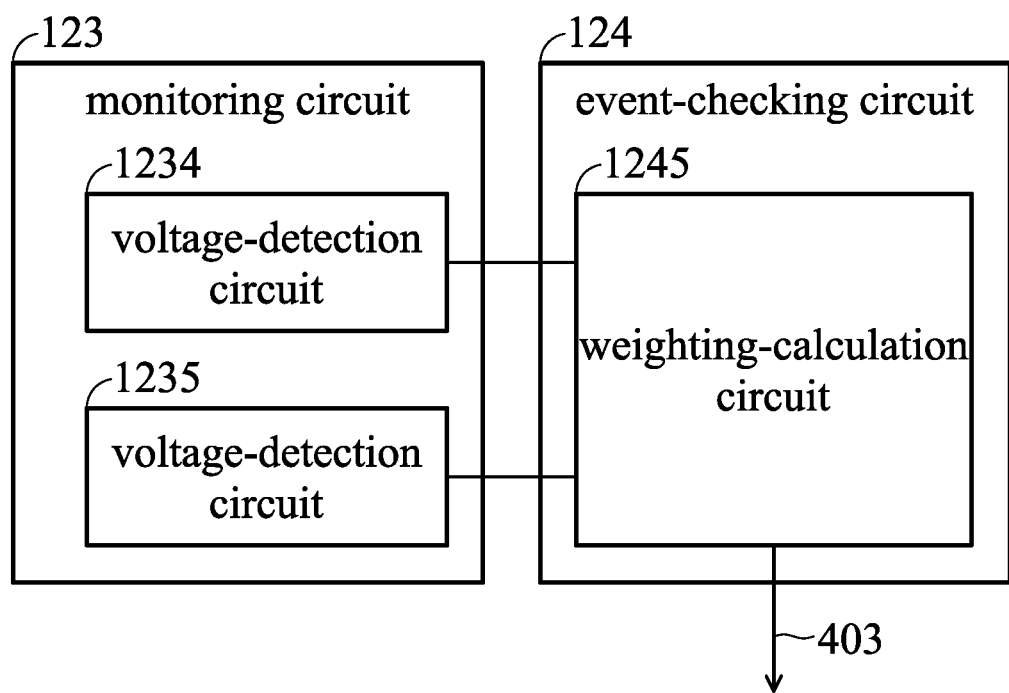

FIGS. 4A~4C are diagrams of the event-checking circuit in accordance with an embodiment of the invention. The event-checking circuit 124 may generate an interrupt-event signal corresponding to each event parameter according to the one or more event parameters detected by the monitoring circuit 123, where the determination for each event parameter may vary.

For example, referring to FIG. 4A, the monitoring circuit 123 includes a unit-data monitoring circuit 1231 and a refresh timer 1232, wherein the unit-data monitoring circuit 1231 is configured to monitor characteristics of the data in the memory cell array 122 to generate data-monitoring information such as the usage of memory rows and columns in the memory cell array 122 or the data error rate. The refresh timer 1232 may calculate the time that has passed since the last refresh, such as a refresh timer value. The event-checking circuit 124 may include a determination circuit 1241 and a comparison circuit 1242.

The determination circuit 1241 may determine whether to generate a corresponding interrupt-event signal according to the data-monitoring information from the unit-data monitoring circuit 1231. For example, in response to the occurrence of the corresponding interrupt event, the interrupt-event signal is in a high logic state.

The comparison circuit 1241 compares the refresh timer value from the refresh timer 1232 with a predetermined time. If the refresh timer value is longer than the predetermined time, the comparison circuit 1242 may generate the interrupt event and the corresponding interrupt-event signal is in the high logic state. In addition, since the data-monitoring information and the refresh timer value are critical event parameters, in response to the occurrence of the interrupt event corresponding to either the data-monitoring information or the refresh timer value, the state of the interrupt events of the data-monitoring information and refresh timer value can be input to an OR gate 1243 to perform an OR operation to generate a corresponding interrupt-event signal 401.

Referring to FIG. 4B, the monitoring circuit 123 includes a temperature sensor 1233 configured to detect temperature information of the memory cell array 122. The event-checking circuit 124, for example, may include a comparison circuit 1244 that may compare the temperature information of the memory cell array 122 detected by the temperature sensor 1233 with one or more temperature thresholds, thereby generating a corresponding interrupt-event signal. For example, the one or more temperature thresholds may include a first temperature threshold T1, a second temperature threshold T2, a third temperature threshold T3, wherein the first temperature threshold T1, the second temperature threshold T2, and the third temperature threshold T3 may be respectively 85° C. 95° C. and 125° C., but the invention is not limited thereto. The third temperature threshold T3 is generally set to the highest tolerable operation temperature of the memory device 120. When it is detected that the temperature information is higher than the third temperature threshold T3, for the sake of safety, the processor 110 or a corresponding control circuit may raise an alarm sound via a speaker or force to shut down the computer system.

For example, when the temperature information is lower than the first temperature threshold T1, the comparison circuit 1244 may generate a first interrupt-event signal. When the temperature information T is between the first temperature threshold T1 and the second temperature threshold T2 (i.e., T1≤T≤T2), the comparison circuit 1244 may generate a second interrupt-event signal. When the temperature information is higher than the third temperature threshold, the comparison circuit 1244 may generate a third interrupt-event signal. Briefly, the first, second, and third interrupt-event signals may indicate different interrupt events in different temperature ranges in which the temperature information is within, and can be represented by the interrupt-event signal 402 shown in FIG. 4B.

Referring to FIG. 4C, the monitoring circuit 123 includes voltage-detection circuits 1234 and 1235. The voltage-detection circuit 1234 may detect the power voltage of the memory device 120, such as a first voltage V1. The voltage-detection circuit 1235 may detect an internal voltage of the memory cell array 122, such as a second voltage V2.

For example, the event-checking circuit 124 may include a weighting-calculation circuit 1245 that is configured to calculate, according to the first voltage V1 and the second voltage V2 from the monitoring circuit 123, a weighted voltage value that is compared with a predetermined voltage threshold VT, wherein the predetermined voltage threshold may be a predetermined ratio (e.g., 90%) of the default operation voltage VDD of the memory device 120. For example, the first voltage V1 has a first weighting value C1, and the second voltage V2 has a second weighting value, wherein the first weighting value C1 and the second weighting value C2 are constants between 0 and 1. Accordingly, the weighting-calculation circuit 1245 may determine whether the weighted voltage value V=(V1*C1+V2*C2) is lower than the predetermined voltage threshold VT. If the weighted voltage value V is lower than the predetermined voltage threshold VT, the weighting-calculation circuit 1245 may generate the corresponding interrupt-event signal 403. If the weighting voltage value V is higher than or equal to the predetermined voltage threshold VT, the weighting-calculation circuit 1245 will not generate the corresponding interrupt-event signal 403.

Specifically, when the weighting voltage value calculated by the weighting-calculation circuit 1245 is lower than the predetermined voltage threshold VT, it may indicate the operation voltage being insufficient for the memory device 120, and thus weighting-calculation circuit 1245 may generate the corresponding interrupt-event signal 403.

Figure 5:
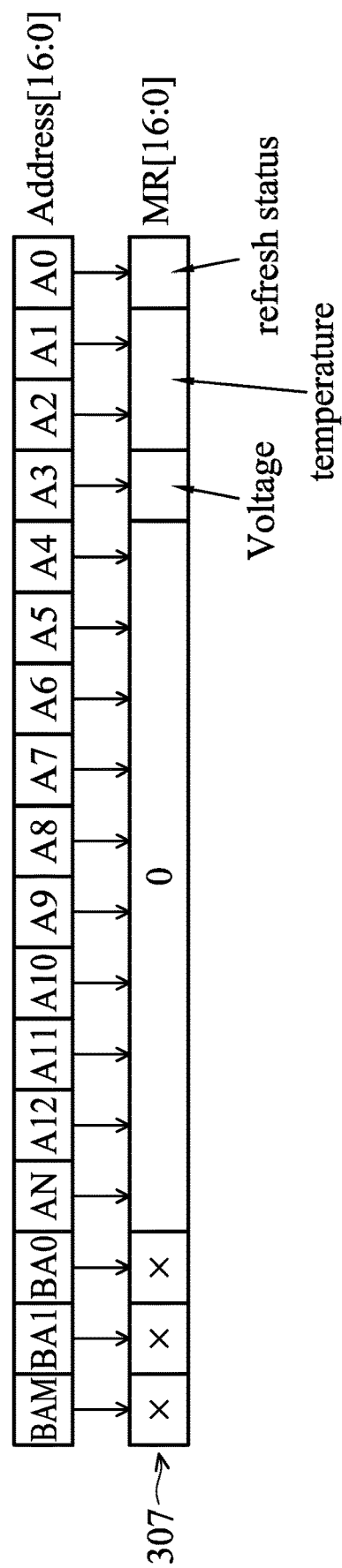
FIG. 5 is a diagram of a mode register in accordance with an embodiment of the invention.

It should be noted that, in the embodiments of FIGS. 4A~4C, in response to generation of the interrupt-event signal of any event parameter, the event-checking circuit 124 may modify the register value corresponding to the interrupt-event signal in the mode register 307, and the details can be referred to the embodiment of FIG. 5.

Referring to both FIG. 3 and FIG. 5, in an embodiment, the mode register 307 of the control logic 121 may pre-record a plurality of operation modes of the memory device 120 and a status of the interrupt event corresponding to each event parameter. As shown in FIG. 5, in an embodiment, the mode register 307 in FIG. 3 may include registers of bits A0~AN and BA0~BAM, where N and M are positive integers. In an embodiment, it is assumed that N=13 and M=2, where the bits A0~A13 and BA0~BA2 are from the processor 110, where A0 denotes the least significant bit of the address, and BA2 denotes the most significant bit of the address. It should be noted that the registers in FIG. 5 is an example of the present invention for purposes of description, and the size of mode register 307, and locations and definitions of bits (or addresses) A0~AN and BA0~BAM can be adjusted according to practical needs.

In the embodiment, the mode register 307 can be represented by a 17-bit register MR[16:0], where MR[16:0]= [BA2, BA1, BA0, A13, A12, A11, A10, A9, A8, A7, A6, A5, A4, A3, A2, A1, A0].

In an embodiment, bits BA0~BA2 correspond to the mode register MR[16:14] that records the operation mode of the memory device 120. For example, when the mode register MR[16:14]=(0, 0, 0), the operation mode of the memory device 120 is MR0; when the mode register [16:14]=(0, 0, 1), the operation mode of the memory device 120 is MR1, and so forth. The relationship between the mode register [16:14] (i.e., corresponding to bits BA2~BA0) and the operation modes of the memory device 120 are expressed in Table 1:

TABLE 1

| BA2 | BA1 | BA0 | Operation Mode |
|-----|-----|-----|----------------|
| 0   | 0   | 0   | MR0            |
| 0   | 0   | 1   | MR1            |
| 0   | 1   | 0   | MR2            |
| 0   | 1   | 1   | MR3            |
| 1   | 0   | 0   | MR4            |
| 1   | 0   | 1   | MR5            |
| 1   | 1   | 0   | MR6            |
| 1   | 1   | 1   | MR7            |

The mode register MR[0] corresponding to bit A0 records the status indicating whether the refresh timer value of the memory cell array 122 has exceeded a predetermined refresh time threshold $T_{REF}$. If the value stored in the mode register MR[0] is 1, it indicates that the refresh timer value has exceeded the predetermined refresh time threshold $T_{REF}$. If the value stored in the mode register MR[0] is 0, it indicates that the refresh operation of the memory cell array 122 is operating normally.

The mode register MR[2:1] corresponding to bits A2 and A1 records the temperature range in which the temperature of the memory cell array 122 is within, such as the first, second, and third temperature range. The relationship between the mode register MR[2:1] and the corresponding temperature range are expressed in Table 2:

TABLE 2

| A2 | A1 | Temperature |
|----|----|-------------|
| 0  | 0  | $T < T1$    |
| 0  | 1  | $T1 \leq T \leq T2$ |

TABLE 2-continued

| A2 | A1 | Temperature |
|----|----|-------------|
| 1  | 0  | $T2 \leq T \leq T3$ |
| 1  | 1  | Reserved    |

The mode register MR[3] corresponding to bit A3 records the status indicating whether the voltage (or weighted voltage value) of the memory cell array 122 is lower than the predetermined voltage threshold VT. If the value stored in mode register MR[3] is 1, it indicates that the voltage V is lower than the predetermined voltage threshold VT. If the value stored in the mode register MR[3] is 0, it indicates that the memory cell array 122 is operated normally.

In an embodiment, after performing determination of each event parameter by the event-checking circuit 124, if it is determined to issue an interrupt-event signal corresponding to a specific event parameter, the event-checking circuit 124 may modify the bit corresponding to the specific event parameter in the mode register 307. For example, when the voltage (or weighted voltage value) V of the memory cell array 122 is lower than the predetermined voltage threshold VT, the event-checking circuit 124 may modify the value of the mode register MR[3] to 1.

Referring to FIG. 3 again, it should be noted that the event-checking circuit 124 modifies the bit corresponding to the occurred interrupt event in the mode register 307 via the internal interrupt arbiter 130 in response to the occurrence of the interrupt event corresponding to each event parameter, such as modifying the register value corresponding to the occurred interrupt event from a normal status (e.g., 0) to an interrupt-event status (e.g., 1). That is, there is an interrupt event to be handled by the memory device 120. When the internal interrupt arbiter 130 has received the interrupt signal from the event-checking circuit 124 and transmitted the interrupt signal to the processor 110 using an arbitration mechanism, the processor 110 may read the register value corresponding to each event parameter from the mode register 307, thereby determining to perform corresponding actions to the occurred interrupt event.

In an embodiment, when the processor 110 has sequentially handled each interrupt event, the processor 110 may modify the status corresponding to each interrupt event in the mode register to a normal status via the internal interrupt arbiter 130, such as modifying the register value corresponding to the occurred interrupt event from the interrupt-event status (e.g., 1) to the normal status (e.g., 0). It should be noted that the register value indicating the normal status or the interrupt-event status of each interrupt event in the mode register 307 modified by the processor or the event-checking circuit 124 does not include the register values corresponding to the temperature information. The register values corresponding to the temperature information may indicate the temperature range within which the memory cell array 122 is operated, such as the first temperature range, the second temperature range, or the third temperature range.

Specifically, the event-checking circuit 124 may assign a weighting parameter to the interrupt event of each event parameter, and calculate a sum value of the weighting parameter corresponding to the interrupt event of each event parameter. When the sum value is greater than or equal to a predetermined threshold, the event-checking circuit 124 may assert an interrupt signal, and transmit the interrupt signal to the processor 110 (e.g., via the internal interrupt arbiter 130).

For example, when the refresh timer value is longer than a predetermined time, the event-checking circuit 124 may generate the interrupt event corresponding to the refresh timer value, and set the weighting parameter of the interrupt event to a first value. When the usage of memory rows and columns of the memory device 120 is higher than a predetermined number, the event-checking circuit 124 may generate the interrupt event corresponding to the usage of memory rows and columns, and set the weighting parameter of the interrupt event to the first value. In addition, when the error-correction-code (ECC) coverage is higher than a predetermined ratio, the event-checking circuit 124 may generate the interrupt event corresponding to the ECC coverage, and set the weighting parameter of the interrupt event to the first value. The first value may be 100% or a predetermined threshold.

Specifically, when an interrupt event corresponding to any of the refresh timer value, the usage of memory rows and columns, and the ECC coverage, it indicates that the memory device 120 requires the processor 110 to handle the interrupt event as soon as possible, thereby preventing the data loss problem. When the event-checking circuit 124 determines that the status corresponding to each interrupt event in the mode register 307 is the normal status, the event-checking circuit de-asserts the interrupt signal.

In an embodiment, when the operation temperature of the memory device 120 is lower than a first temperature threshold T1 (e.g., 85° C.), the event-checking circuit 124 may set the weighting parameter of the interrupt event corresponding to the operation temperature to a second value (e.g., 60%). When the operation temperature of the memory device 120 is between the first temperature threshold T1 (e.g., 85° C.) and a second temperature threshold T2 (e.g., 95° C.), the event-checking circuit 124 may set the weighting parameter of the interrupt event corresponding to the operation temperature to a third value (e.g., 50%). When the operation temperature of the memory device 120 is between the second temperature threshold T2 (e.g., 95° C.) and a third temperature threshold T3 (e.g., 125° C.), the event-checking circuit 124 may set the weighting parameter of the interrupt event corresponding to the operation temperature to a fourth value (e.g., 40%). It should be noted that, upon detecting the temperature information of the memory device 120 is higher than the third temperature threshold T3, for the sake of safety, the processor 110 or the corresponding control circuit may raise an alarm sound via a speaker or force to shut down the computer system.

Additionally, when the operation voltage of the memory cell array 122 is less than a predetermined ratio (e.g., 90%) of a predetermined operation voltage VDD, the event-checking circuit 124 may set the weighting parameter of the interrupt event corresponding to the operation temperature to a fifth value (e.g., 30%). When the leakage current of the memory cell array 122 is greater than a predetermined current, the event-checking circuit 124 may set the weighting parameter of the interrupt event corresponding to the operation temperature to a sixth value (e.g., 30%).

When the sum value of each weighting parameter is greater than or equal to the predetermined threshold, the event-checking circuit 124 may assert an interrupt signal, and transmit the interrupt signal to the processor 110 (e.g., via the internal interrupt arbiter 130), so that the processor 110 may handle the one or more interrupt events of the memory cell array 122.

In an embodiment, the processor 110 may handle each interrupt event with a respective way. For example, with regard to the interrupt event corresponding to the refresh timer value, the processor 110 may activate the function of auto refresh or self refresh of the memory cell array 122 (i.e., originally deactivated to improve performance). With regard to the interrupt event corresponding to the temperature, the processor 110 may activate a cooling mechanism of the computer system 100, such as starting a cooling fan (not shown in FIG. 1) or lowering the clock frequency. In addition, the processor 110 may also increase the refresh frequency of the memory cell array 122. With regard to the interrupt event corresponding to the operation voltage, the processor 110 may control the power supply (not shown in FIG. 1) of the computer system 100 to increase the operation voltage of the memory cell array 122.

With regard to the interrupt event corresponding to the leakage current of the memory cell array 122, the processor 110 may increase the driving voltage and current of a low-dropout regulator of the computer system 100 to reduce the leakage current. With regard to the interrupt event corresponding to the usage of memory rows and columns in the memory cell array 122, the processor 110 may re-configure the setting of the memory cell array 122 to prevent over-usage of memory rows or columns. With regard to the interrupt event corresponding to the ECC coverage, the processor 110 may adjust the length of the ECC, such as adjusting the 1-bit ECC to a 2-bit ECC, but the invention is not limited thereto.

Figure 6:
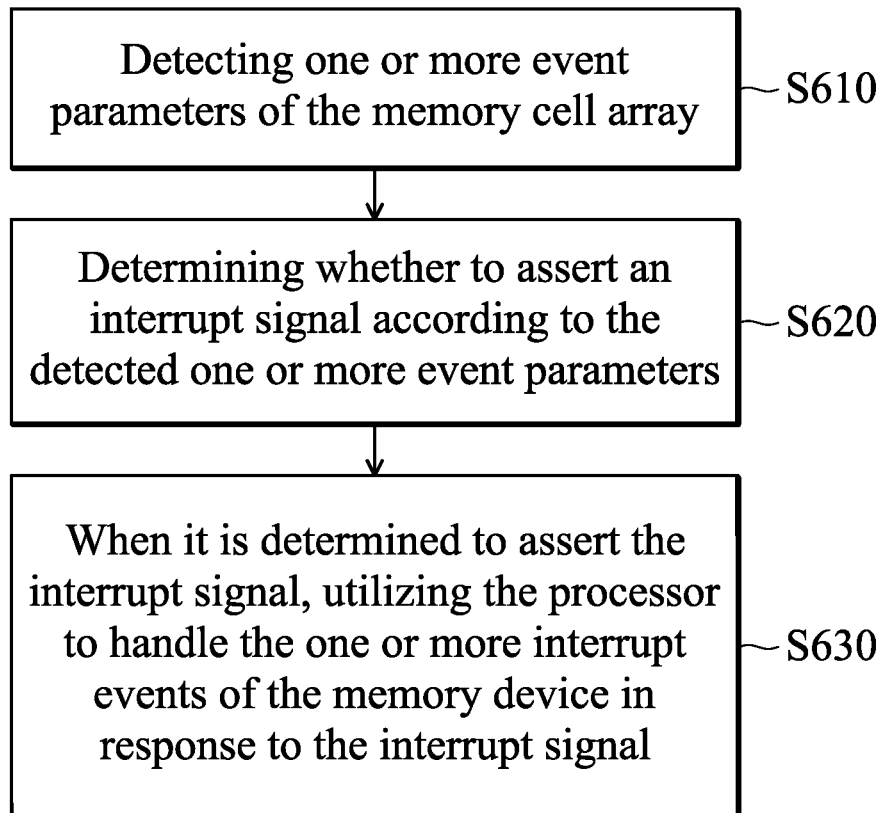
FIG. 6 is a flow chart of a method for handling interrupts in a memory device in accordance with an embodiment of the invention.

FIG. 6 is a flow chart of a method for handling interrupts in a memory device in accordance with an embodiment of the invention.

In step S610, one or more event parameters of the memory cell array 122 are detected. For example, the monitoring circuit 123 may include different types of monitoring sub-circuits, such as a voltage-detection circuit, a refresh timer, a temperature sensor, a unit-data monitoring circuit, etc., to monitor different event parameters of the memory cell array 122, wherein the event parameters may include a refresh timer, an operation temperature, an operation voltage, a leakage current, usage of memory rows and columns, an error-correction-code (ECC) coverage of the memory cell array 122, or a combination thereof.

In step S620, it is determined whether to assert an interrupt signal according to the detected event parameters. For example, different event parameters have different determination conditions to determine whether a corresponding interrupt event occurs, and the event-checking circuit 124 calculates a sum value of the weighting parameter of each event parameter.

In step S630, when it is determined to assert the interrupt signal, the processing is utilized to handle the one or more events of the memory device in response to the interrupt signal. For example, when the sum value is greater than or equal to a predetermined threshold, the event-checking circuit 124 may assert the interrupt signal, and transmit the interrupt signal to the processor 110 via the internal interrupt arbiter 130, so that the processor 110 handles the one or more interrupt events of the memory cell array 122. In addition, the processor 110 handles different interrupt events in different ways, and the aforementioned embodiment can be referred to for details.

In view of the above, a memory device and a method for handling interrupts thereof are provided. The memory device and the method are capable of detecting one or more event parameters of the memory cell array in the memory device, and determining whether to actively assert an interrupt signal according to the interrupt event corresponding to each event parameter, thereby informing the processor to handle the occurred interrupt events. Since the interrupt signal is controlled by the memory device, it indicates that the memory device may actively determine whether to refresh the memory cell array, and the function of auto refresh and self refresh can be deactivated to reduce the burden for the processor to periodically refresh the memory device, thereby improving the performance of the computer system.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
a memory cell array;
a monitoring circuit, configured to detect one or more event parameters of the memory cell array, wherein the one or more event parameters correspond to one or more interrupt events of the memory cell array;
an event-checking circuit, configured to determine whether to assert an interrupt signal according to the one or more event parameters detected by the monitoring circuit; and
a control logic, configured to control the memory cell array according to a command from a processor, wherein the control logic comprises a mode register that pre-records a plurality of operation modes of the memory cell array and a status of the interrupt event corresponding to each event parameter,
wherein in response to the event-checking circuit determining to assert the interrupt signal, the event-checking circuit directly transmits the interrupt signal to the processor via a physical interrupt pin of the memory device, so that the processor handles the one or more interrupt events of the memory device according to the interrupt signal,
wherein in response to the processor having handled each interrupt event sequentially, the processor changes the status of each interrupt event in the mode register to a normal status.

2. The memory device as claimed in claim 1, wherein the one or more event parameters comprise a refresh timer, an operation temperature, an operation voltage, a leakage current, usage of memory rows and columns, an error-correction-code (ECC) coverage of the memory cell array, or a combination thereof.

3. The memory device as claimed in claim 2, wherein the event-checking circuit determines whether the interrupt event corresponding to each event parameter occurs, and in response to an occurrence of the interrupt event corresponding to each event parameter, the event-checking circuit assigns a weighting value to each event parameter, and calculates a sum value of the weighting value of each event parameter,
wherein in response to the sum value being larger than or equal to a predetermined threshold, the event-checking circuit asserts the interrupt signal.

4. The memory device as claimed in claim 3, wherein when the refresh timer is longer than a predetermined time, the event-checking circuit sets the weighting parameter corresponding to the refresh timer to a first value,
in response to the usage of memory rows and columns being larger than a predetermined number, the event-checking circuit sets the weighting parameter corresponding to the usage of memory rows and columns to the first value,
in response to the ECC coverage being larger than a predetermined ratio, the event-checking circuit sets the weighting parameter corresponding to the ECC coverage to the first value.

5. The memory device as claimed in claim 3, wherein:
in response to the operation temperature being lower than a first temperature threshold, the event-checking circuit sets the weighting parameter corresponding to the operation temperature to a second value;
in response to the operation temperature being between the first temperature threshold and a second temperature threshold, the event-checking circuit sets the weighting parameter corresponding to the operation temperature to a third value; and
in response to the operation temperature being between the second temperature threshold and a third temperature threshold, the event-checking circuit sets the weighting parameter corresponding to the operation temperature to a fourth value;
wherein the third temperature threshold is greater than the second temperature threshold, and the second temperature threshold is greater than the first temperature threshold.

6. The memory device as claimed in claim 3, wherein in response to the operation voltage being lower than a specific ratio of a predetermined operation voltage, the event-checking circuit sets the weighting parameter corresponding to the operation voltage to a fifth value.

7. The memory device as claimed in claim 3, wherein in response to the leakage current being greater than a predetermined current, the event-checking circuit sets the weighting parameter corresponding to the leakage current to a sixth value.

8. The memory device as claimed in claim 1, wherein in response to the event-checking circuit determining that the status of each interrupt event in the mode register is the normal status, the event-checking circuit de-asserts the interrupt signal.

9. The memory device as claimed in claim 1, wherein the event-checking circuit issues the interrupt signal having the highest priority to a system interrupt arbiter outside the memory device, and the system interrupt arbiter transmits a fast-interrupt-request signal to the processor, and the processor handles the one or more interrupt events of the memory device in response to the interrupt signal to restore the memory device to normal operation.

10. A method for handling interrupts in a memory device, wherein the memory device comprises a memory cell array and a control logic, and the control logic controls the memory cell array in response to a command from a processor, wherein the control logic comprises a mode register that pre-records a plurality of operation modes of the memory cell array and a status of the interrupt event corresponding to each event parameter, the method comprising:

detecting one or more event parameters of the memory cell array, wherein the one or more event parameters correspond to one or more interrupt events of the memory cell array;

determining, by the memory device, whether to assert an interrupt signal according to the detected one or more event parameters;

when it is determined to assert the interrupt signal, directly sending the interrupt signal to the processor through a physical interrupt pin of the memory device to utilize the processor to handle the one or more interrupt events of the memory device in response to the interrupt signal; and in response to the processor having handled each interrupt event sequentially, modifying the status of each interrupt event in the mode register to a normal status.

11. The method as claimed in claim 10, wherein the one or more event parameters comprise a refresh timer, an operation temperature, an operation voltage, a leakage current, usage of memory rows and columns, an error-correction-code (ECC) coverage of the memory cell array, or a combination thereof.

12. The method as claimed in claim 11, further comprising:

determining whether the interrupt event corresponding to each event parameter occurs;

in response to the occurrence of the interrupt event corresponding to each event parameter, assigning a weighting value to each event parameter, and calculating a sum value of the weighting value of each event parameter; and in response to the sum value being larger than or equal to a predetermined threshold, asserting the interrupt signal.

13. The method as claimed in claim 12, further comprising:

in response to the refresh timer being longer than a predetermined time, setting the weighting parameter corresponding to the refresh timer to a first value, in response to the usage of memory rows and columns being larger than a predetermined number, setting the weighting parameter corresponding to the usage of memory rows and columns to the first value, in response to the ECC coverage being larger than a predetermined ratio, setting the weighting parameter corresponding to the ECC coverage to the first value.

14. The method as claimed in claim 12, further comprising:

in response to the operation temperature being lower than a first temperature threshold, the event-checking circuit sets the weighting parameter corresponding to the operation temperature to a second value;

in response to the operation temperature being between the first temperature threshold and a second temperature threshold, the event-checking circuit sets the weighting parameter corresponding to the operation temperature to a third value; and in response to the operation temperature being between the second temperature threshold and a third temperature threshold, the event-checking circuit sets the weighting parameter corresponding to the operation temperature to a fourth value;

wherein the third temperature threshold is greater than the second temperature threshold, and the second temperature threshold is greater than the first temperature threshold.

15. The method as claimed in claim 12, further comprising:

in response to the operation voltage being lower than a specific ratio of a predetermined operation voltage, setting the weighting parameter corresponding to the operation voltage to a fifth value.

16. The method as claimed in claim 12, further comprising:

in response to the leakage current being greater than a predetermined current, setting the weighting parameter corresponding to the leakage current to a sixth value.

17. The method as claimed in claim 10, further comprising:

in response to determining that the status of each interrupt event in the mode register is the normal status, de-asserting the interrupt signal.

18. The method as claimed in claim 10, further comprising:

issuing the interrupt signal having the highest priority to a system interrupt arbiter outside the memory device;

transmitting a fast-interrupt-request signal to the processor by the system interrupt arbiter; and utilizing the processor to handle the one or more interrupt events of the memory device in response to the interrupt signal to restore the memory device to normal operation.

\* \* \* \* \*